United States Patent [19]

McCook et al.

[11] 4,177,497

[45] Dec. 4, 1979

[54] INSTRUMENT CLUSTER ASSEMBLY

[75] Inventors: Thomas J. McCook, Wilmette; John F. Shragal, River Grove, both of Ill.

[73] Assignee: Stewart-Warner Corporation, Chicago, Ill.

[21] Appl. No.: 865,636

[22] Filed: Dec. 29, 1977

Related U.S. Application Data

[63] Continuation of Ser. No. 690,636, May 27, 1976, abandoned, which is a continuation of Ser. No. 522,023, Nov. 8, 1974, abandoned.

[51] Int. Cl.² .................................... H02B 1/04
[52] U.S. Cl. ........................... 361/331; 174/72 A; 339/17 D; 361/421; 362/29
[58] Field of Search ........... 180/90 R; 174/72A; 362/23, 28, 29, 362; 339/17 C, 17 D, 193 P, 258 C; 324/115, 156, 157; 116/114 AE; 361/331, 346, 356, 358, 364, 365, 380, 400, 406, 408, 421

[56] References Cited

U.S. PATENT DOCUMENTS

| 2,894,240 | 7/1959 | Mautner | 339/17 D |
|---|---|---|---|
| 3,009,010 | 11/1961 | Stearns | 174/72 A |
| 3,015,718 | 1/1962 | Petri | 174/68.5 |
| 3,022,447 | 2/1962 | Henss | 361/346 |
| 3,174,576 | 3/1965 | Woofter | 174/72 A |
| 3,590,136 | 6/1971 | Kunishi | 174/50 |

Primary Examiner—Gerald P. Tolin
Attorney, Agent, or Firm—Augustus G. Douvas; Dillis V. Allen

[57] ABSTRACT

An indicator assembly having a plurality of indicators mounted in a common rectangular housing having a rear wall, there being provided a circuit plate integrally molded in the rear wall of the housing that provides the necessary circuitry for actuating each of the indicators from a remote transducer, the circuit plate prior to being molded into the rear wall of the housing having narrow cut-out portions defining the circuits in the plate with small web bridges across these cut-out portions to provide the necessary support for the plate prior to insertion molding into the rear wall, and after molding the housing these supporting webs are selectively removed through the housing rear wall and the circuit plate at each of these webs to isolate the circuits in the circuit plate.

6 Claims, 10 Drawing Figures

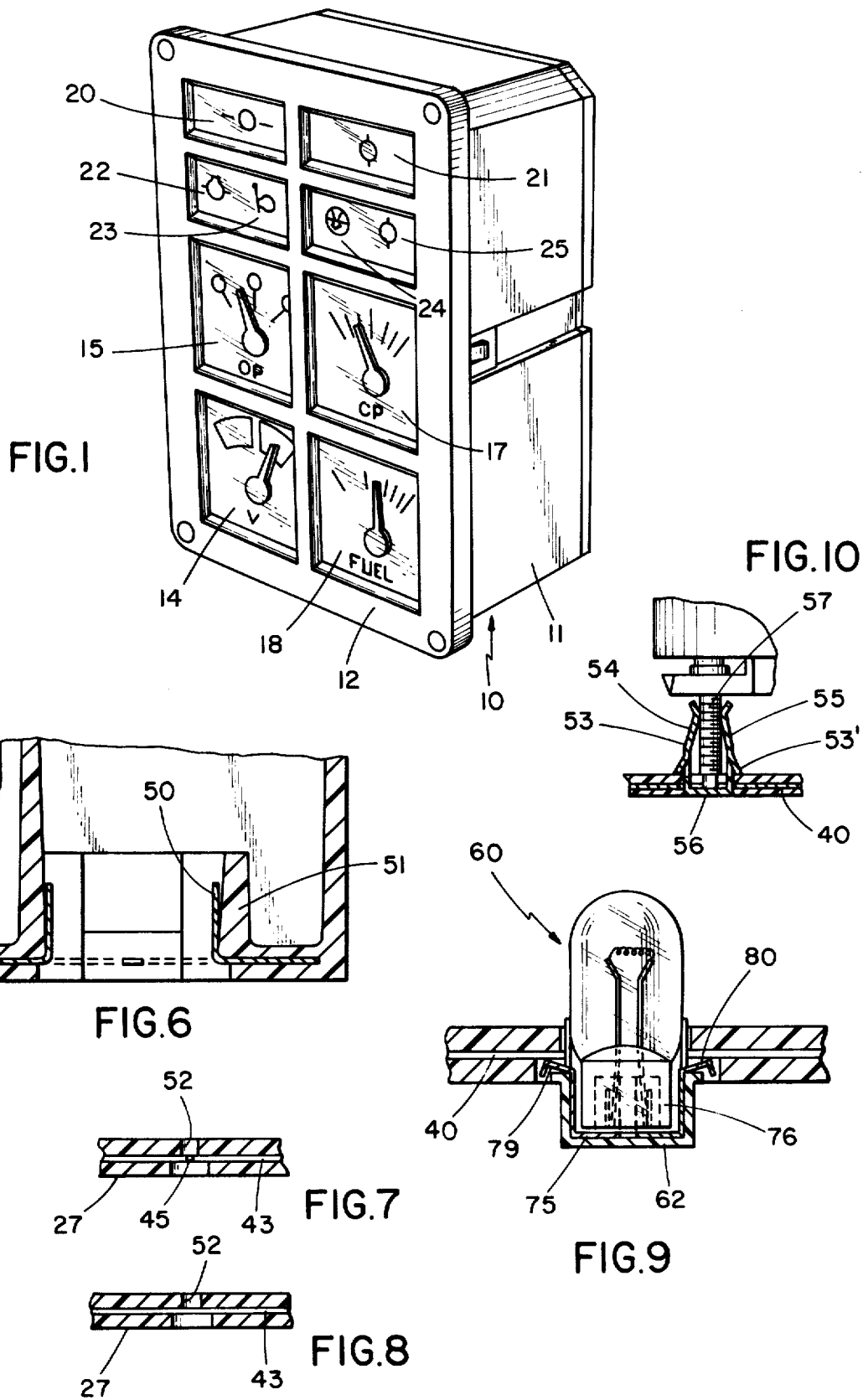

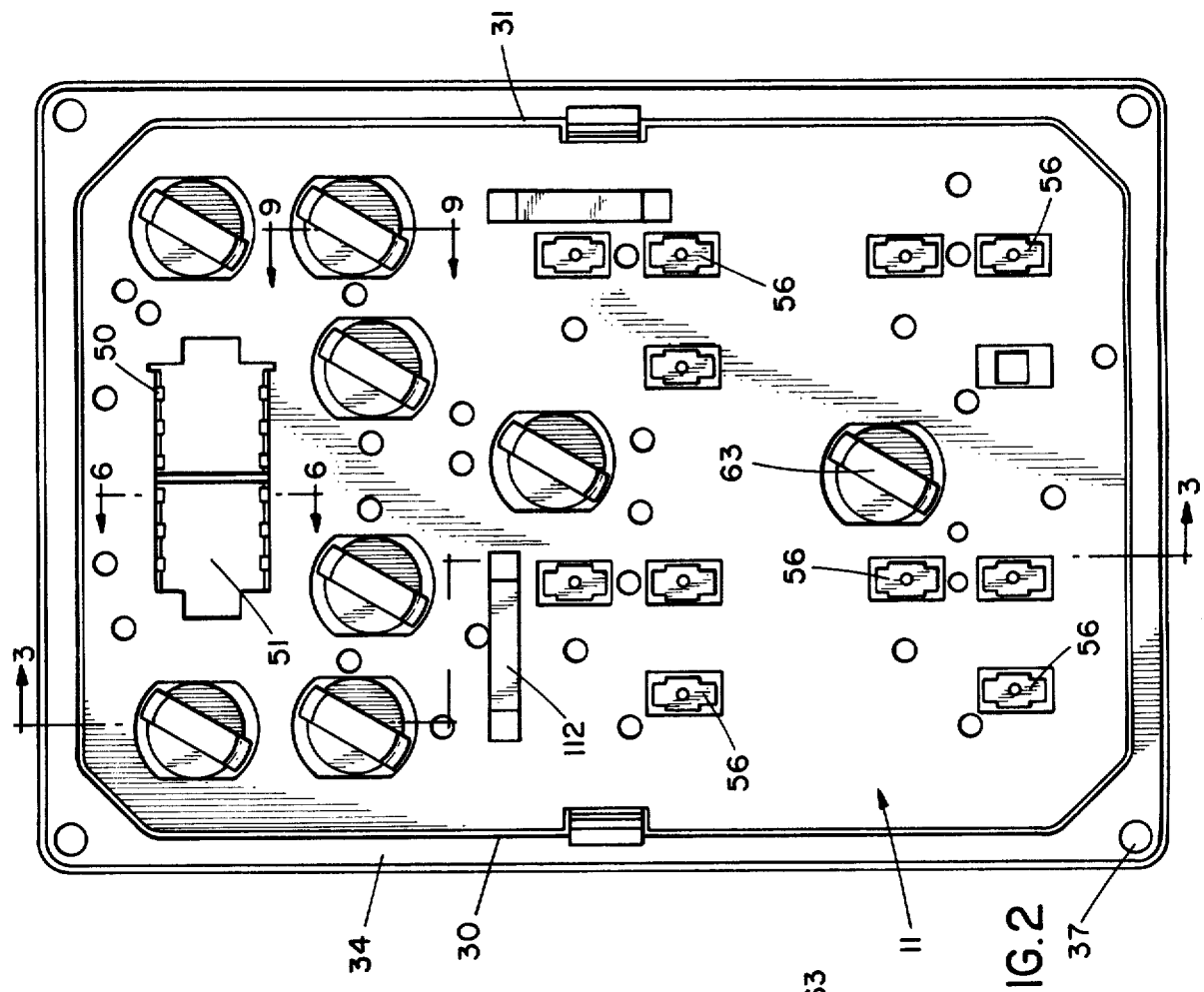
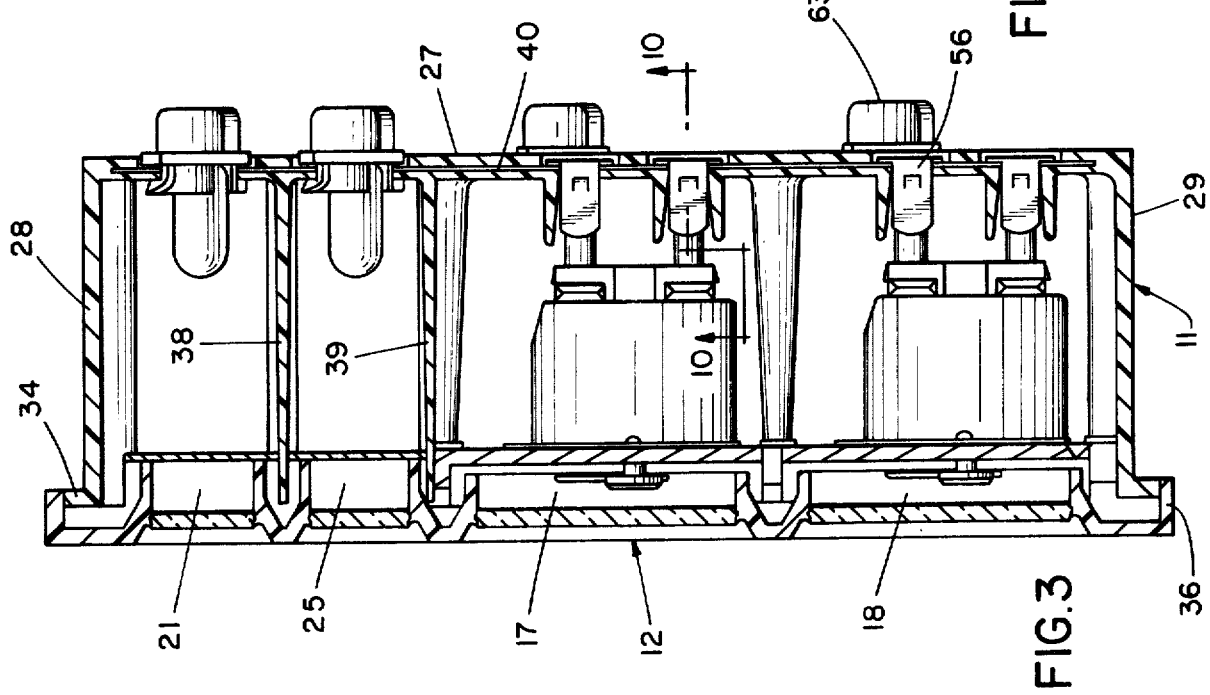

INSTRUMENT CLUSTER ASSEMBLY

BACKGROUND OF THE PRESENT INVENTION

This application is a continuation of application Ser. No. 690,636, filed May 27, 1976 which is a continuation of parent application Ser. No. 522,023, filed Nov. 8, 1974, assigned to the assignee of the present invention, both now abandoned.

Instrument assemblies or clusters have been provided in the past for such use as automobile instrumentation and the like. The instruments are actuated through senders, transducers or simple acutators. In the automobile field, such indicators may include fuel indication, battery voltage, oil pressure, coolant temperature and directional indicators. In order to provide the necessary circuitry for interconnecting the indicators to their actuators and ground, there have been two basic methods employed to effect this purpose. Firstly, there has been provided separate individual wiring from each indicator contact to its associated sender, electrical system, and ground. This, quite obviously, can be a complex wiring process requiring significant assembly time and also it lacks the desired rugged characteristic of a superior instrumentation system.

A second method employed in the past for providing electrical circuitry for indicator assemblies is the provision of printed circuit boards interconnecting the indicators to their respective senders, etc. The disadvantage in such circuit boards is that they are expensive, or limited in the thickness of the circuit board, and are not sufficiently rugged in construction.

It is the primary object of the present invention to overcome these prior art problems.

SUMMARY OF THE PRESENT INVENTION

In accordance with the present invention an indicator or instrument assembly is provided with an integrally molded housing having a flat circuit plate insert molded directly into the bottom or back wall of the housing providing an extremely rugged construction at a reduced cost and providing the flexibility of varied materials in the circuit plate itself. The circuit plate provides substantially all of the circuit interconnections between the indicators and their senders, actuators, ignition and ground.

Toward this end the circuit plate is initially stamped with a plurality of narrow cut-out portions with a plurality of webs being provided across the cut-out portions for the purpose of supporting the circuit plate during assembly. The circuit plate is thereafter insert molded into the bottom wall of the housing itself, and then the circuit plate is drilled through the bottom wall at the point of each web isolating the circuits one from the other.

Another feature of the present invention is the provision of generally U-shaped clips extending up through the circuit plate into the housing that provide both electrical connectors and support for the indicators within the housing itself. These clips also permit the instruments to be inserted into the housing in plug-in fashion. To assist in supporting the indicators within the housing there are provided a plurality of integrally molded posts extending upwardly from the bottom wall of the housing and having interconnecting portions on the top thereof which engage cooperating snap-on type fastening elements on the indicators themselves.

Some of the indicators are bulb type, such as used for directional indication, and these are held in the assembly by having key slots in the circuit plate which receive rotary fastening key based indicator bulb assemblies.

BRIEF DESCRIPTION OF THE DRAWINGS

FIG. 1 is a perspective view of an indicator assembly according to the present invention;

FIG. 2 is an enlarged rear view of the indicator assembly;

FIG. 3 is a longitudinal section of the indicator assembly taken generally along line 3—3 of FIG. 2;

FIG. 6 is an enlarged cross-section of the terminals taken generally along line 6—6 of FIG. 2;

FIG. 7 is a fragmentary section taken generally along line 7—7 of FIG. 5; showing the narrow webs in the circuit plate prior to removal;

FIG. 8 is a fragmentary section similar to FIG. 8, subsequent to drilling out the narrow web in the circuit plate;

FIG. 9 is a fragmentary section taken generally along line 9—9 of FIG. 2 illustrating one of the indicator bulb assemblies in position; and FIG. 10 is a fragmentary section taken generally along line 10—10 of FIG. 3, illustrating one of the connector clips in position.

DETAILED DESCRIPTION OF THE PREFERRED EMBODIMENT

Figure 5:
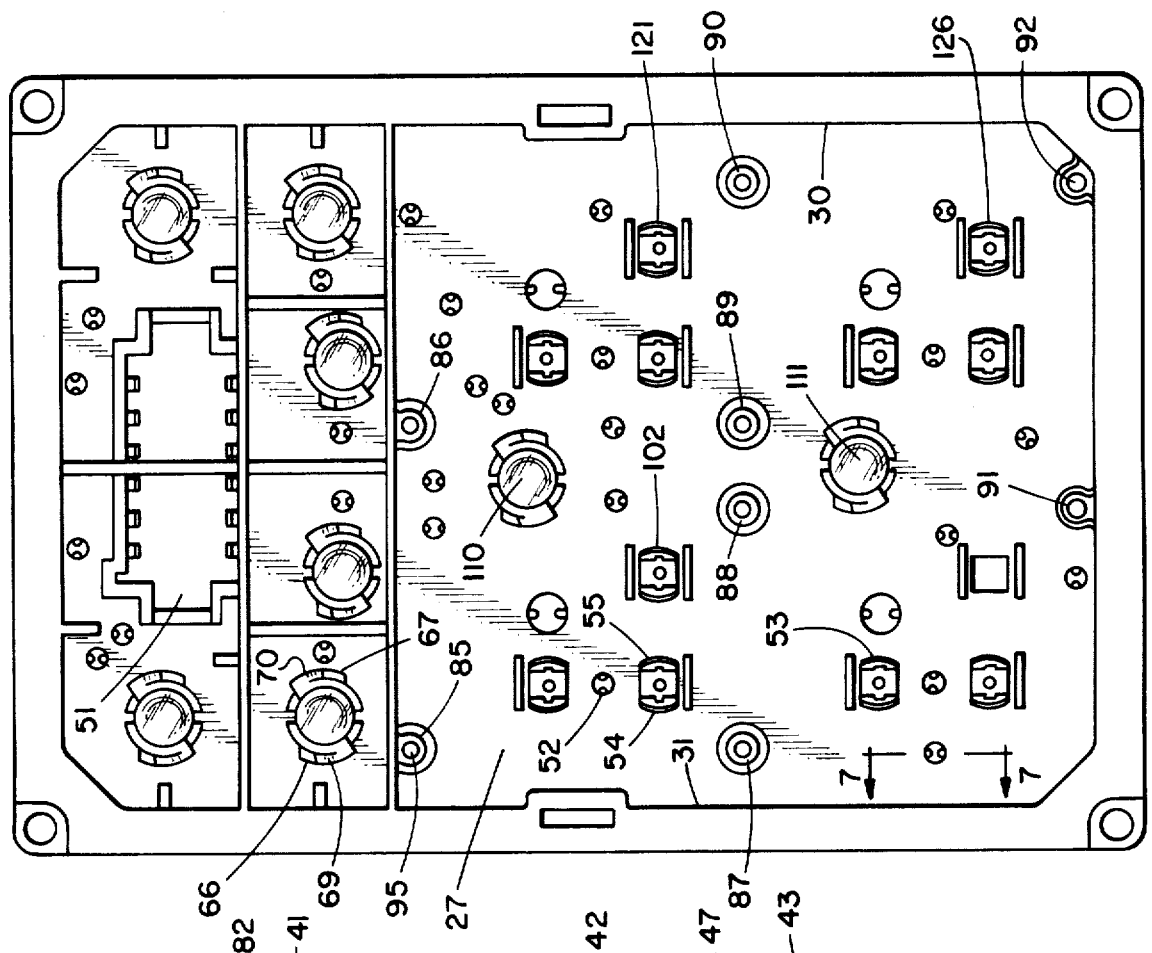
FIG. 5 is a front view of the indicator assembly shown in FIG. 2 with some of the instruments removed.

Referring to the drawings, and particularly FIG. 1, an indicator assembly 10 is illustrated including an integrally molded housing 11, cover plate 12, and indicators including a voltage indicator 14, an oil pressure indicator 15, a coolant temperature indicator 17 and a fuel indicator 18, as well as miscellaneous illumination type indicators 20, 21, 22, 23, 24 and 25.

As seen in FIGS. 2, 3 and 5, the housing 11 is an integrally molded plastic body including a back wall 27, top and bottom walls 28 and 29, respectively, and side walls 30 and 31. A flange 34 surrounds the top of the top, bottom and side walls as shown clearly in FIGS. 2 and 3, for the purpose of receiving a cooperating flange 36 on the periphery of the cover plate 12. Suitable fasteners extend through apertures 37 for the purpose of attaching the cover to the housing 11 after the instruments have been placed in position. Partitions, such as at 38 and 39, shown in FIG. 3, isolate the instruments 20, 21, 22, 23, 24 and 25.

To provide the necessary circuitry between each of the indicators and their senders, ignition and ground, where desired, a flat conductive circuit plate 40 is provided integrally molded in the bottom wall 27 by conventional insert molding techniques.

Figure 4:
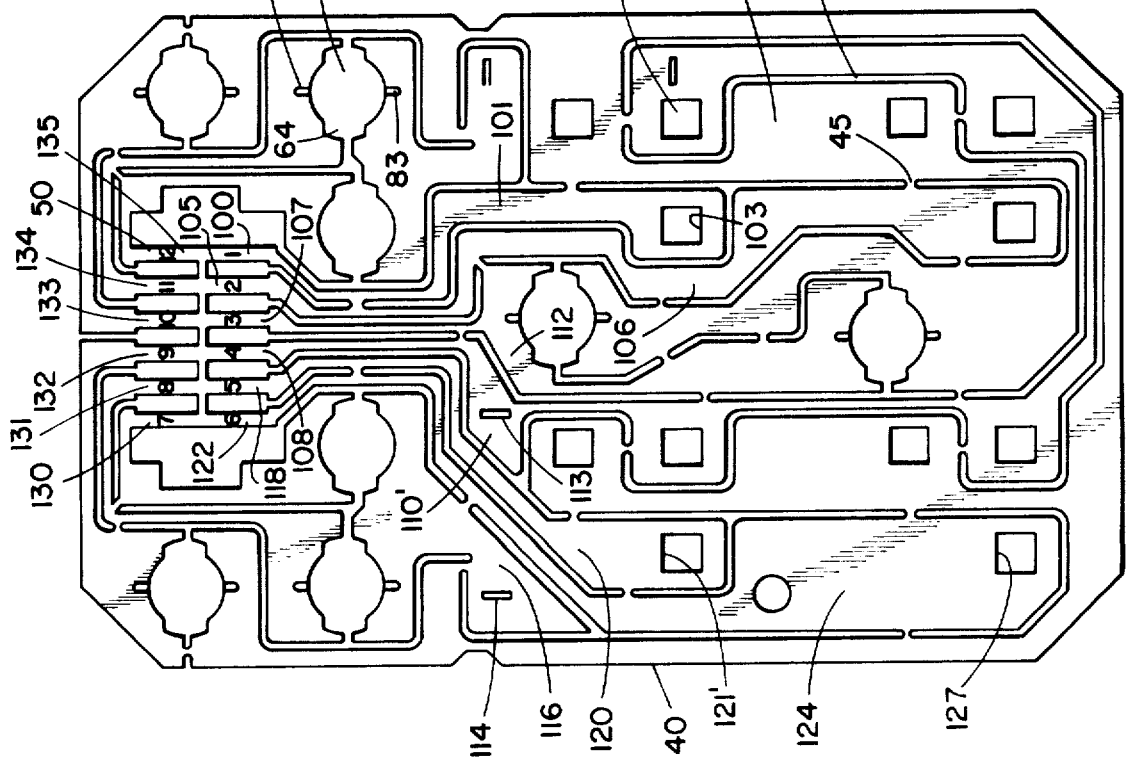
FIG. 4 is a subassembly view of the circuit plate.

As seen clearly in FIG. 4, the flat circuit plate is a conductive rectangularly shaped plate having enlarged apertures 41 for receiving indicator bulb assemblies, smaller rectangular apertures 42, for receiving clips that support and provide a conductive path with instruments 14, 15, 17 and 18, and a plurality of narrow cut-out portions 43. Spaced along the various cut-out portions 43 are web portions indicated at 45 for the primary purpose of supporting the sheet during assembly and for the secondary purpose of providing selective circuit paths. As will appear hereinafter, most all of the webs 45 are removed after molding into the bottom wall 27 of housing 11, since at that time the plate no longer requires support.

The areas 47, as seen in FIG. 4 between the cut-out portions 43, provide the conductive paths for the instruments. Each of these conductive paths is connected to terminals 50 that, as shown in FIG. 6, are bent into a receiving boss 51 in the bottom of the housing 11 that is adapted to receive a terminal contact box (not shown) for the entire indicator assembly 10.

The circuit plate 40 is integrally molded in the back wall 27 in a position so that each of the web portions 45 is aligned with an aperture 52 in the back wall, as shown in FIGS. 5 and 7. Thereafter, most, if not all, of the apertures 52 are punched or otherwise removed (as seen in FIG. 8), removing the webs 45, and at this time the circuits are isolated from one another. It is also possible not to remove certain of the webs to alter the conductive paths in the circuit plate 40.

For the purpose of providing an electrical connection between the instruments 14, 15, 17 and 18, and ignition, ground, and sender signal, contact clips 53 are provided, shown clearly in FIG. 10. Clips 53 are generally U-shaped in construction, having legs 54 and 55, and a bottom portion 56 that engages the rear wall of the circuit plate 40 to provide electrical contact therewith. The legs 54 and 55 firmly grasp a threaded projection 57 projecting rearwardly from the associated instrument. Clips 53 have retractable shear formed tabs 53' which snap outwardly upon insertion of a clip. These tabs keep clips from falling out.

As seen clearly in FIG. 9, the indicator and illuminating bulb assemblies also project through the circuit plate 40 and through the rear wall 27. Indicator bulb assembly 60 is the indicator bulb associated with indicator 22 which may, for example, be a transmission oil temperature warning indicator. The indicator and illuminating bulb assemblies 60 have generally circular bases 62 with diametrical rear projections 63 for the purpose of facilitating insertion and rotation of the assembly 60 into the back wall 27 of the housing 11. As shown in FIGS. 4 and 5, each of the circuit plate apertures 41 is recessed at 64 and 65, as well as the inner surface of the back plate 27, as shown at 66 and 67. The base 62 has radial projections 69 and 70 which fit within the recesses 66 and 67, after which the indicator assembly 60 is rotated by the thumb projection 63 and held firmly in position in the back plate.

A contact strip 75 is positioned between bulb base 76 and the base 62 and has contact members 79 and 80 which engage portions 82 and 83 of the circuit plate 40, as seen clearly in FIG. 4. This provides the necessary electrical connections between the indicator or illuminator 60 and the circuit plate 40. It should be understood that the indicators 60 are easily removable and replaceable as a result of this construction.

With respect to the instruments 14, 15, 17 and 18, they may be directly plugged into the housing 11 as a result of the clips 53 cooperating with rearward projections 57. To further assist in holding the instruments 14, 15, 17 and 18 in position, there are provided, as shown in FIGS. 3 and 5, posts 85, 86, 87, 88, 89, 90, 91 and 92, formed integrally with and projecting upwardly from the bottom wall 27. At the top of the posts 85-92 are short shaft portions 95, as seen in FIG. 5, that receive a U-shaped flexible clamp portion on each of the instruments. It should be noted that diagonal posts 85 and 88 support instrument 15, posts 86 and 90 instrument 17, posts 87 and 91 instrument 14 and posts 89 and 92 support instrument 18. The posts 85-92 permit, along with the clips 53, the instruments to be directly inserted into the housing 11 without the need for any manual fasteners.

The circuit plate in FIG. 4 represents a typical circuit for the indicator assembly or cluster shown, but it should be understood that other circuit configurations may be easily devised. It is believed helpful to briefly explain the portions of the circuit plate shown in FIG. 4. Terminal 100 receives the sender signal to the oil pressure gauge 15 through conductive path 101 to conductive clip 102 (see FIG. 5), which is mounted in aperture 103, in the circuit plate shown in FIG. 4. Note that FIG. 4 represents a back view of the circuit panel, while FIG. 5 represents a front view of the assembly with the instruments removed. Terminal 105 provides a common ground through conductive path 106. Terminal 107 provides power to lamps 110 and 111 through conductive path 112 in plate 40. Terminal 108 is the ignition battery terminal providing a conductive path through portion 110' in the plate, as shown in FIG. 4.

It should be noted that various conductive paths can be interconnected by clips 112', shown in FIG. 2, which have legs which project through apertures 113 and 114, thus connecting conductive path 110' with conductive path 116.

Terminal 118 carries the sender signal to the temperature gauge 17 through conductive path 120, which has electrical contact with clip 121 associated with the temperature gauge 17. Fuel gauge 18 is driven through terminal 122 through conductive portion 124 to clip 126 which is seated within aperture 127 shown in FIG. 4.

The remaining terminals 130 to 135 are connected up to actuate the remaining instruments in the assembly 10, and may be easily traced on the circuit of FIG. 4.

It should be understood that the terminals as shown in FIG. 4 are illustrated in their uncut position, while in FIG. 6 they are cut. The center portion, after molding into the wall 27 is cut out and the remaining free ends are bent into the boss 51, as shown clearly in FIG. 6.

What is claimed is:

1. An indicator assembly, comprising; housing means, a plurality of indicators mounted on said housing means, each of said indicators having electrical connectors, terminals in said housing means providing current to said indicators, a conductive standard circuit plate permanently carried by said housing means and providing electrical circuit paths for said indicators through said connectors from said terminals, said paths being provided by relatively narrow cut-out portions in said plate and conductor paths in said plate that are substantially wider than the cut-out portions, said housing means being constructed of plastic, said cut-out portions each having a small bridge portion of plate along their length, said housing means having a plurality of apertures therein, each positioned adjacent one of the bridge portions so that the bridge portions are visable from outside the housing and may be selectively removed to achieve different circuit patterns from a standard circuit plate, and said circuit paths being insert molded in said housing means.

2. An indicator assembly as defined in claim 1, wherein said indicators are connected to said circuit plate by a plurality of U-shaped clips in said housing means.

3. An indicator assembly as defined in claim 1, wherein said housing means has a rear wall, and including clip means on the back of said rear wall extending through the circuit plate and from one path to another providing at least a portion of the circuit.

4. An indicator assembly as defined in claim 3, including a plurality of enlarged apertures in said rear wall exposing portions of said circuit plate, and additional indicators in at least some of said enlarged apertures.

5. An indicator assembly as defined in claim 4, including illumination bulbs mounted in others of said enlarged apertures.

6. An indicator assembly comprising; housing means, an indicator mounted on said housing means, said indicator having electrical connectors, terminal means in said housing means providing current to said indicator, a conductive standard circuit plate carried by said housing means and providing electric current paths for said indicator through said connectors from said terminal means, said paths being provided by cut-out portions in said plate defining conductive strips therebetween, said housing means being constructed of plastic, said cut-out portions having a plurality of small transverse bridge portions of plate along their length interconnecting the conductive strips, means on said housing means providing access to said plate adjacent the bridge portions so that the bridge portions may be selectively removed to achieve different circuits from a standard circuit plate, and wherein said means providing access is a plurality of apertures in said housing means adjacent said bridge portions to provide access thereto for selective removal of the bridge portions.

* * * * *